(12) United States Patent
He

(10) Patent No.: US 10,466,547 B2
(45) Date of Patent: Nov. 5, 2019

(54) DISPLAY PANEL, ARRAY SUBSTRATE AND MANUFACTURING METHOD FOR THE SAME

(71) Applicant: Shenzhen China Star Optoelectronics Technology Co., Ltd., Shenzhen, Guangdong (CN)

(72) Inventor: Hui He, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 15/577,207

(22) PCT Filed: Sep. 21, 2017

(86) PCT No.: PCT/CN2017/102625
§ 371 (c)(1),
(2) Date: Nov. 27, 2017

(87) PCT Pub. No.: WO2019/019316
PCT Pub. Date: Jan. 31, 2019

(65) Prior Publication Data
US 2019/0033640 A1  Jan. 31, 2019

(30) Foreign Application Priority Data
Jul. 27, 2017  (CN) .......................... 2017 1 0627023

(51) Int. Cl.
G02F 1/1339 (2006.01)
G02F 1/1362 (2006.01)
(Continued)

(52) U.S. Cl.
CPC ........ *G02F 1/13394* (2013.01); *G02F 1/1368* (2013.01); *G02F 1/136227* (2013.01);
(Continued)

(58) Field of Classification Search
None
See application file for complete search history.

(56) References Cited

U.S. PATENT DOCUMENTS 7,292,294 B2  2/2007  Hung et al.
7,535,540 B2  5/2009  SangChul et al.
(Continued)

FOREIGN PATENT DOCUMENTS

CN  1609637 A  4/2005
KR  20040059001 A  7/2004

*Primary Examiner* — Phu Vu
(74) *Attorney, Agent, or Firm* — Andrew C. Cheng

(57) ABSTRACT

A display panel, an array substrate and a manufacturing method are disclosed. The method includes steps of: providing a substrate; disposing a thin-film transistor on the substrate; disposing R color resist layer, G color resist layer, a blue B color resist layer and a white W color resist layer on the thin-film transistor; forming a planarization layer on the R color resist layer, the G color resist layer, the B color resist layer and the W color resist layer, and through a multi-tone mask to form a first protection layer, a spacer layer and a vias having different thicknesses. The present invention forms the first protection layer, the spacer layer and the vias only through one process so as to reduce the manufacturing process to reach the purpose of simplifying the process. Besides, the present invention also manufactures a W color resist layer to increase the transmittance and brightness.

10 Claims, 4 Drawing Sheets

(51) Int. Cl.
*G02F 1/1368* (2006.01)
*H01L 27/12* (2006.01)
*G02F 1/1333* (2006.01)

(52) U.S. Cl.
CPC ...... *H01L 27/1222* (2013.01); *H01L 27/1262* (2013.01); *H01L 27/1288* (2013.01); *G02F 2001/13396* (2013.01); *G02F 2001/133357* (2013.01); *G02F 2001/136222* (2013.01); *G02F 2201/52* (2013.01)

(56) References Cited

U.S. PATENT DOCUMENTS

| | | | |
|---|---|---|---|
| 8,107,039 B2 | 1/2012 | Kim et al. | |
| 2016/0202543 A1* | 7/2016 | Park | G02F 1/13394 349/42 |
| 2016/0306210 A1* | 10/2016 | Oh | G02F 1/13394 |

* cited by examiner

DISPLAY PANEL, ARRAY SUBSTRATE AND MANUFACTURING METHOD FOR THE SAME

BACKGROUND OF THE INVENTION

1. Field of the Invention

The present invention relates to a display technology field, and more particularly to a display panel, an array substrate and a manufacturing method for the same.

2. Description of Related Art

A liquid crystal display panel usually includes a color filter substrate, an array substrate and liquid crystals filled between the array substrate and the color filter substrate in order to form a liquid crystal cell. Wherein, the color filter substrate is used for realizing a color picture display. A COA (Color-filter on Array) technology is an integrated technology that directly manufacturing a color filter layer on an array substrate. The COA substrate of the conventional art includes M1 (gate electrode layer), GI-AS (semiconductor layer), M2 (source electrode and drain electrode), PVI (protection layer), R/G/B (color resist layer), PV2 (protection layer), and ITO (pixel electrode). Besides, the color filter substrate further includes two manufacturing processes of BM/PS (black matrix and spacer layer) such that 9-10 mask photolithography processes are required totally. A new technology BPS (black matrix and spacer layer) that integrates the BM (black matrix) and PS (spacer layer) to save a BM process, and using a PFA (Polyfluoroalkoxy) transparent photoresist material to replace PV2. However, M1 (gate electrode layer), GI-AS (semiconductor layer), M2 (source electrode and drain electrode), PVI (protection layer), R/G/B (color resist layer), PV2 (protection layer), and ITO (pixel electrode) BPS, totally 8-9 mask photolithography process are required so that the process is cumbersome.

Besides, the color filter substrate of the conventional art does not include a white color filter film. Recently, some researchers offer some solutions to add the white color filter film. Adding the white color filter film can control the display brightness and color saturation. Comparing to the conventional art, the display effect is improved. However, the solutions of adding white color filter film generally refer to the above conventional art, that is, adopting one photolithography process such that adding one W mask to realize the solutions so that the process is cumbersome.

In summary, the manufacturing process of the conventional art is cumbersome.

SUMMARY OF THE INVENTION

The main technology problem solved by the present invention is to provide a display panel, an array substrate and a manufacturing method, which can increase transmittance and brightness, which can simplify the manufacturing process.

In order to solve the above technology problem, a technology solution adopted by the present invention is: a manufacturing method for an array substrate, comprising steps of: providing a substrate; disposing a thin-film transistor on the substrate; disposing a red (R) color resist layer, a green (G) color resist layer, a blue (B) color resist layer and a white (W) color resist layer on the thin-film transistor; forming a planarization layer on the R color resist layer, the G color resist layer, the B color resist layer and the W color resist layer, and through a multi-tone mask to form a first protection layer, a spacer layer and a vias, wherein, the first protection layer, the spacer layer and the vias have different thicknesses.

In order to solve the above technology problem, another technology solution adopted by the present invention is: an array substrate, comprising: a substrate; a thin-film transistor disposed on the substrate; a red (R) color resist layer, a green (G) color resist layer, a blue (B) color resist layer and a white (W) color resist layer on the thin-film transistor; and a planarization layer formed on the R color resist layer, the G color resist layer, the B color resist layer and the W color resist layer, wherein, the planarization layer is formed with a first protection layer, a spacer layer and a vias having different thicknesses through a multi-tone mask.

In order to solve the above technology problem, another technology solution adopted by the present invention is: a display panel, wherein, the display panel includes an array substrate and a color filter substrate disposed oppositely and a liquid crystal layer disposed between the array substrate and the color filter substrate, and the array substrate comprises: a substrate; a thin-film transistor disposed on the substrate; a red (R) color resist layer, a green (G) color resist layer, a blue (B) color resist layer and a white (W) color resist layer on the thin-film transistor; and a planarization layer formed on the R color resist layer, the G color resist layer, the B color resist layer and the W color resist layer, wherein, the planarization layer is formed with a first protection layer, a spacer layer and a vias having different thicknesses through a multi-tone mask.

The advantageous effect of the present invention is: comparing to the conventional art, the present invention provides a display panel, an array substrate and a manufacturing method. The method includes steps of: providing a substrate; disposing a thin-film transistor on the substrate; disposing R color resist layer, G color resist layer, a blue B color resist layer and a white W color resist layer on the thin-film transistor; forming a planarization layer on the R color resist layer, the G color resist layer, the B color resist layer and the W color resist layer, and through a multi-tone mask to form a first protection layer, a spacer layer and a vias having different thicknesses. The present invention forms the first protection layer, the spacer layer and the vias only through one process so as to reduce the manufacturing process to reach the purpose of simplifying the process. Besides, the present invention also manufactures a W color resist layer to increase the transmittance and brightness.

DETAILED DESCRIPTION OF THE PREFERRED EMBODIMENT

Figure 1:
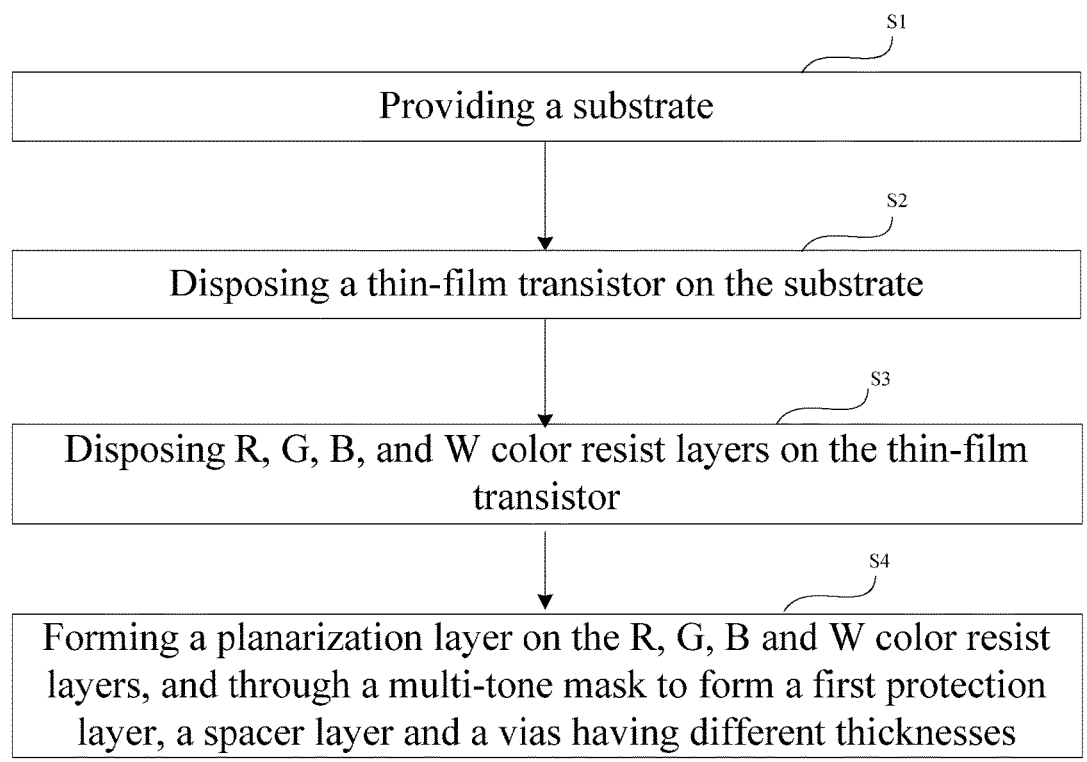
FIG. 1 is a flow chart of a manufacturing method for an array substrate provided by an embodiment of the present invention.
Figure 2:
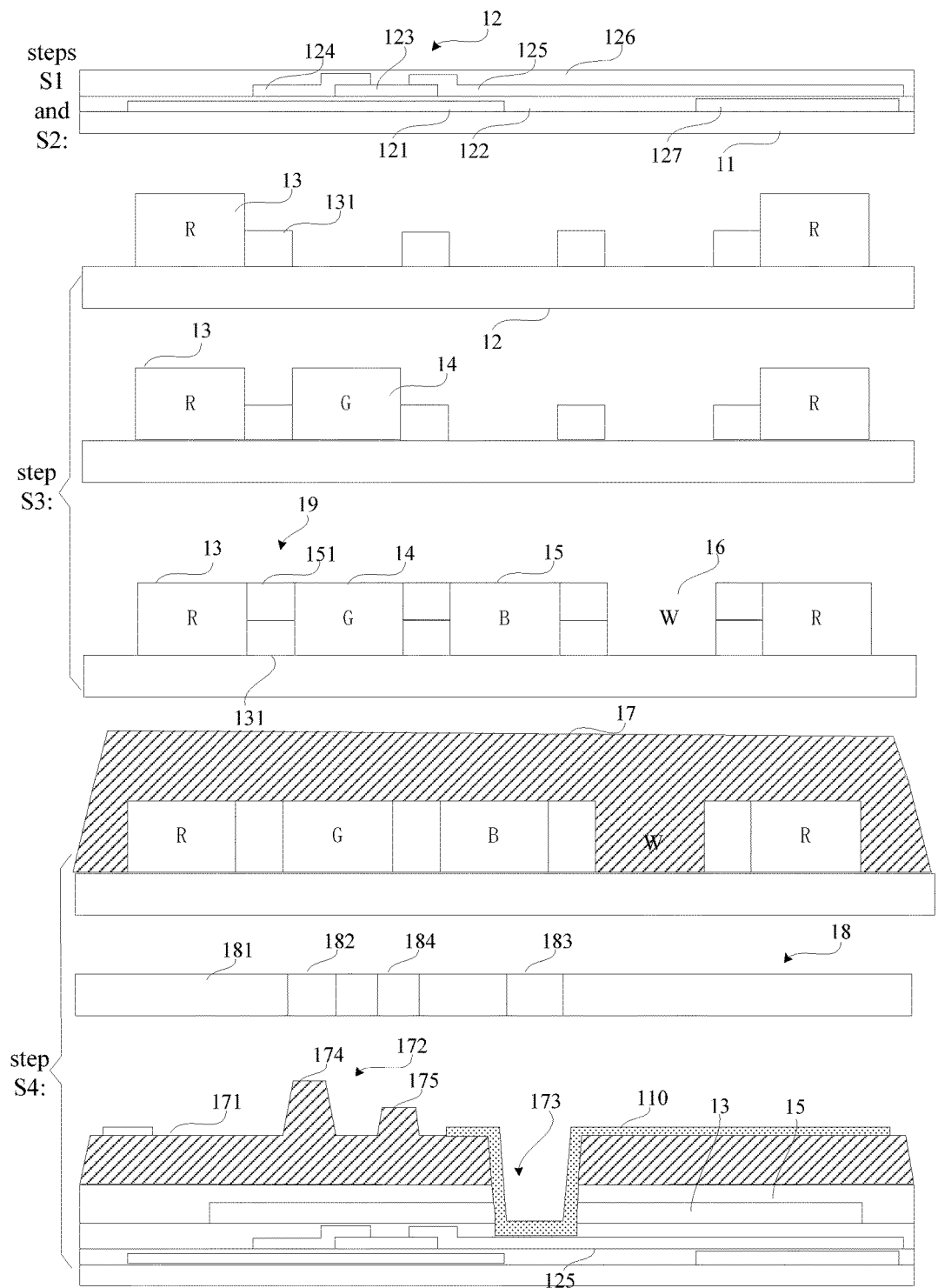
FIG. 2 is a schematic diagram of manufacturing processes corresponding to the manufacturing method shown in FIG. 1.

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention With reference to FIG. 1 and FIG. 2 together, wherein, FIG. 1 is a flow chart of a manufacturing method for an array substrate provided by an embodiment of the present invention, and FIG. 2 is a schematic diagram of manufacturing processes corresponding to the manufacturing method shown in FIG. 1. As shown in FIG. 1 and FIG. 2, the manufacturing method of the array substrate of the present embodiment comprises following steps:

Step S1: providing a substrate 11.

Wherein, the substrate 11 can be a glass substrate, and operations of cleaning and drying can be performed to the glass substrate further.

Step S2: disposing a thin-film transistor 12 on the substrate 11.

Specifically, sequentially disposing a gate electrode layer 121, a gate insulation layer 122, a semiconductor layer 123, a source electrode layer 124, a drain electrode layer 125 and a second protection layer 126 in a stacked arrangement.

Wherein, when disposing the gate electrode layer 121, a common electrode 127 is further disposed. That is, the common electrode 127 and the gate electrode layer 121 are disposed at a same layer. The source electrode layer 124 and the drain electrode layer 125 are respectively disposed at two terminals of the semiconductor layer 123. The semiconductor layer 123 can be a polycrystalline silicon semiconductor. Each of the gate electrode layer 121, the source electrode layer 124 and the drain electrode layer 125 can be a metal material.

In another embodiment, a buffering layer can be disposed between the substrate 11 and a gate electrode layer 121 in order to prevent water vapor from entering to the gate electrode layer 121 at a side of the substrate 11.

Step S3: disposing R, G, B, and W color resist layers 13-16 on the thin-film transistor 12.

In the present step, specifically, separately disposing a R (red color), a G (green color), a B (blue color) and a W (white color) color resist layers 13-16 on a second protection layer 126. The R, G, B and W color resist layers 13-16 are located at a same layer. Besides, forming a black matrix layer 19 between two of the color resist layer by using a half-tone mask method in forming at least two of the R, G and B color resist layers 13-15.

Specifically, as shown in FIG. 2, firstly, coating a film of the R color resist layer, called R color resist film, on the second protection layer 126. Then, performing a complete patterning at a location required disposing the R color resist layer 13 in order to form the R color resist layer 13. Performing a patterning at a location required forming the black matrix layer 19 using a half-tone mask in order to form a half R color resist film 131, a thickness of the half R color resist film 131 is one-half of a thickness of the R color resist layer 13. At the other locations (including W color resist layer 16), a normal exposing is performed in order to remove excess R color resist film.

Wherein, "a complete patterning" is comparing to "a patterning using a half-tone mask". Specifically, "a complete patterning" means that in a normal photolithography process, a patterning that fully reserves the thickness of the R color resist layer 13. "a patterning using a half-tone mask" means that a patterning that removes a portion of the film of the R color resist layer 13 in a thickness direction.

When manufacturing a G color resist layer 14, disposing a film of the G color resist layer 14, called a G color resist film, on the R color resist layer 13 and the half R color resist film 131. Then, performing a complete patterning to a location required forming the G color resist layer 14 in order to form the required G color resist layer 14. At the other locations (including W color resist layer 16), performing a normal exposing in order to remove excess G color resist film. Wherein, a thickness of the G color resist layer 14 and a thickness of the R color resist layer 13 are the same.

When manufacturing the B color resist layer 15, the operation principle is the same as manufacturing the R color resist layer 13. That is, coating a film of the B color resist layer, called a B color resist film, on the R color resist layer 13, the half R color resist film 131 and the G color resist layer 14. Then, performing a complete patterning to a location required forming the B color resist layer 15 in order to form the required B color resist layer 15. At the same time, performing a patterning at a location required forming the black matrix layer 19 using a half-tone mask in order to form a half B color resist film 151, a thickness of the half B color resist film 151 is one-half of a thickness of the B color resist layer 15. At the other locations (including W color resist layer 16), a normal exposing is performed in order to remove excess B color resist film. Wherein, the thickness of the B color resist layer 15, the thickness of the R color resist layer 13 and the thickness of the G color resist layer 14 are the same.

Accordingly, when forming the R color resist layer 13 and the B color resist layer 15, using two half-tome masks to perform a patterning in order to obtain a half R color resist film 131 and a half B color resist film 151. Finally, the two half color resist films are overlapped to form the black matrix layer 19, and the thickness of the black matrix layer 19 is the same as the thickness of the R color resist layer, the thickness of the G color resist layer and the thickness of the B color resist layer so that a height difference is avoided.

In the above example, one half of the color resist film of the R color resist layer 13 and one half of the color resist film of the B color resist layer 15 are overlapped to form the black matrix layer 19. It can be understood that one half of the color resist film of the R color resist layer 13 and one half of the color resist film of the G color resist layer 14 or one half of the color resist film of the G color resist layer 14 and one half of the color resist film of the B color resist layer 15 can be overlapped to form the black matrix layer 19. Or, one third of color resist films of the R, G, and B color resist layers 13-15 are overlapped to form the black matrix layer 19. I can be understood that one half of the color resist film and one third of the color resist film both mean one half and one third of the thickness of the color resist film.

In the present step, because when manufacturing the R, G and B color resist layers 13-15, a normal exposing is performed to the other locations (including the W color resist layer 16), the W color resist layer 16 forms a structure having an opening.

Step S4: forming a planarization layer 17 on the R, U, B and W color resist layers 13-16, and through a multi-tone mask to form a first protection layer 171, a spacer layer 172 and a vias 173, wherein, the first protection layer 171, the spacer layer 172 and the vias 173 have different thicknesses. Because the W color resist layer 16 is the structure having an opening, the planarization layer 17 is directly filled in the W color resist layer 16. The planarization layer 17 is made of polyfluoroalkoxy (PFA) transparent photoresist material so that a transparent function of the W color resist layer 16 will not be affected.

Wherein, the vias 173 reveals the source electrode layer 124 or the drain electrode layer 125. Furthermore, a pixel electrode 110 may be provided on the planarization layer 17, and the pixel electrode 110 is electrically connected to the drain electrode layer 125 or the source electrode layer 124 through the vias 173. In the present embodiment, the pixel electrode 110 is electrically connected to the drain electrode layer 125. In another embodiment, the pixel electrode 110 can be electrically connected to the source electrode layer 124.

Wherein, the spacer layer 172 includes a main spacer layer 174. The present step specifically is:

providing a mask 18, wherein, a first region 181, a second region 182 and a third region 183 of the mask 18 respectively have a first transmittance n1, a second transmittance n2 and a third transmittance n3. Through the mask 18 to perform a patterning to the planarization layer 17 in order to respectively form the first protection layer 171, the main spacer layer 174 and the vias 173 having different thicknesses.

Furthermore, the spacer layer 172 further includes an auxiliary spacer layer 175. A fourth region 184 of the mask 18 has a fourth transmittance n4. In the present step, when performing a patterning to the planarization layer 17 through the mask 18, a location of the planarization layer 17 corresponding to the fourth region 184 forms the auxiliary spacer layer 175 that has a thickness different from the first protection layer 171, the main spacer layer 174 and the vias 173.

Wherein, the PFA material of the planarization layer 17 can be a positive photoresist material or a negative photoresist material. For negative PFA material, the first protection layer 171 and the W photoresist layer 16 are manufactured through a mask having a transmittance of 30%-50%. That is, the transmittance n1 of the first region 181 of the mask 18 is 30%-50%. The main spacer layer 174 is a fully transparent region, the transmittance is 100%. That is, the transmittance n2 of the second region 182 of the mask 18 is 100%. The auxiliary spacer layer 175 is manufactured through a mask having a transmittance of 50%-80%. That is, the transmittance n4 of the fourth region 184 of the mask 18 is 50%-80%. The vias 173 is a non-transparent region. That is, the transmittance n3 of the third region 183 of the mask 18 is 0.

For positive PFA material, the situation is opposite, specifically, the first protection layer 171 and the W photoresist layer 16 are manufactured through a mask having a transmittance of 50%-80%. That is, the transmittance n1 of the first region 181 of the mask 18 is 50%-80%. The vias 173 is a fully transparent region, the transmittance is 100%. That is, the transmittance n3 of the third region 183 of the mask 18 is 100%. The main spacer layer 174 is a non-transparent region. That is, the transmittance n2 of the second region 182 of the mask 18 is 0. The auxiliary spacer layer 175 is manufactured through a mask having a transmittance of 30%-50%. That is, the transmittance n4 of the fourth region 184 of the mask 18 is 30%-50%.

PFA material is not limited, the only requirement is a transparent photoresist material.

Accordingly, the present embodiment forms the first protection layer 171, the spacer layer 172 and the vias 173 only through one process so as to reduce the manufacturing process in order to reach the purpose of simplifying the process. Besides, the present invention also manufactures a W color resist layer 16 in order to increase the transmittance and brightness.

The present invention also provides an array substrate, the array substrate is manufactured through the manufacturing method described above. Specifically, referring to FIG. 3 to FIG. 5.

Figure 3:
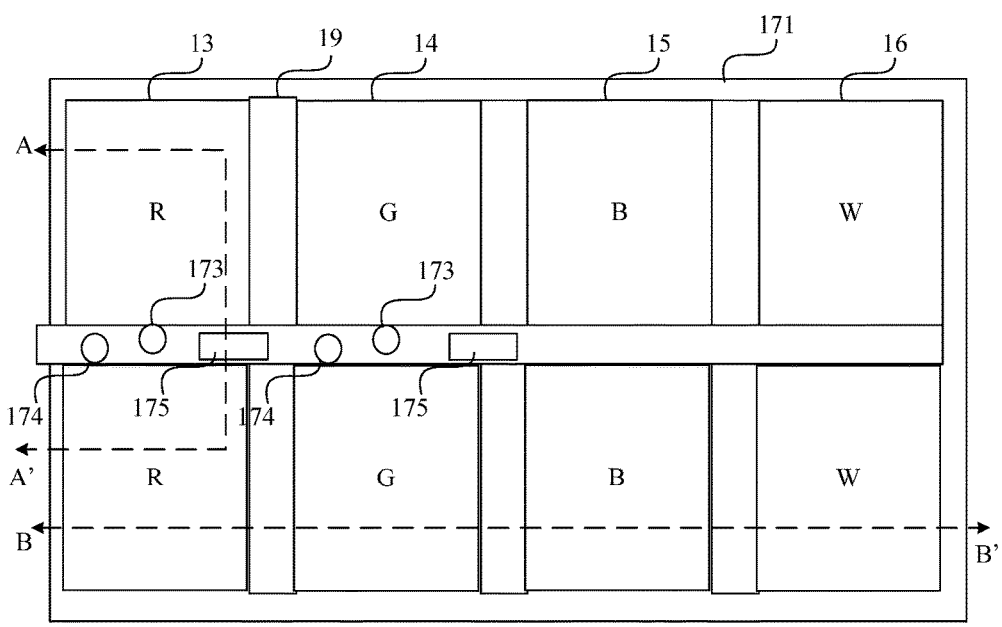
FIG. 3 is a schematic diagram of an array substrate provided by an embodiment of the present invention.
Figure 4:
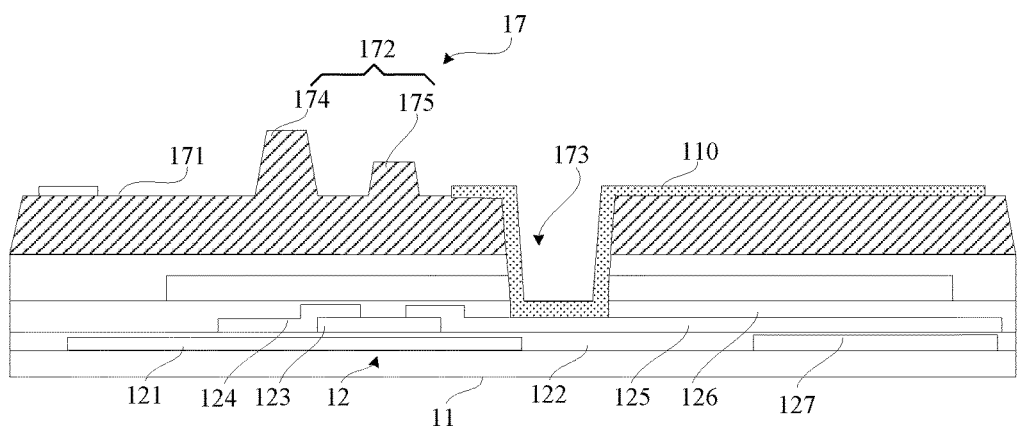
FIG. 4 is a cross-sectional view of an array substrate along AA' direction shown in FIG. 3.
Figure 5:
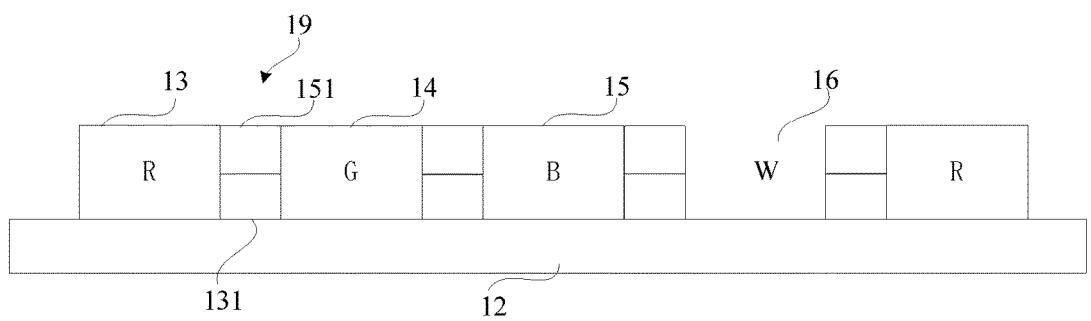
FIG. 5 is a cross-sectional view of an array substrate along BB' direction shown in FIG. 3.

With reference to FIG. 3 to FIG. 5, the array substrate of the present invention includes an array substrate 11, a thin-film transistor 12, R, G, B and W color resist layers 13-16 and a planarization layer 17.

Wherein, the thin-film transistor 12 is disposed on the substrate 11. the thin-film transistor 12 comprises a gate electrode layer 121, a gate insulation layer 122, a semiconductor layer 123, a source electrode layer 124, a drain electrode layer 125 and a second protection layer 126 disposed in a stacked arrangement; Besides, a common electrode layer 127 disposed at a same layer as the gate electrode layer 121.

R, G, B and W color resist layers 13-16 are disposed on the thin-film transistor 12. Specifically, the R, G, B and W color resist layers 13-16 are sequentially and separately disposed on the second protection layer 126. Besides, the R, G, B and W color resist layers 13-16 are located at the same layer.

The array substrate 10 further includes a black matrix layer 19, the black matrix layer 19 is disposed between two of the color resist layers, and the black matrix layer 19 is formed using a half-tone mask method in forming at least two of the R, G and B color resist layers 13-15. The specific operation principle is as described above, no more repeating.

The planarization layer 17 is disposed on the R, G, B and W color resist layers 13-16 and the black matrix layer 19. Wherein, the planarization layer 17 forms a first protection layer 171, a spacer layer 172 and a vias 173 having different thicknesses through a multi-tone mask. Wherein, the vias 173 reveals the source electrode layer 124 or the drain electrode layer 125. The array substrate 10 further includes a pixel electrode 110 disposed on the first protection layer 171, electrically connected to the drain electrode layer 125 through the vias 173. In another embodiment, the pixel electrode 110 can also be electrically connected to the source electrode layer 124.

Wherein, the spacer layer 172 includes a main spacer layer 174. Wherein, the first protection layer 171, the main spacer layer 174 and the vias 173 having different thicknesses are formed through patterning the planarization layer 17 by a mask. A first region, a second region and a third region of the mask respectively have a first transmittance, a second transmittance and a third transmittance. The structure of the mask is as described above, no more repeating.

The spacer layer 172 further includes an auxiliary spacer layer 175. A thickness of the auxiliary spacer layer 175 is different from the first protection layer 171, the main spacer layer 174 and the vias 173. The auxiliary spacer layer 175 is formed through the mask by patterning the planarization layer 17, and a fourth region of the mask has a fourth transmittance The deposition of the specific first protection layer 171, the main spacer layer 174, the auxiliary spacer layer 175 and the vias 173 is as described above, no more repeating.

Figure 6:
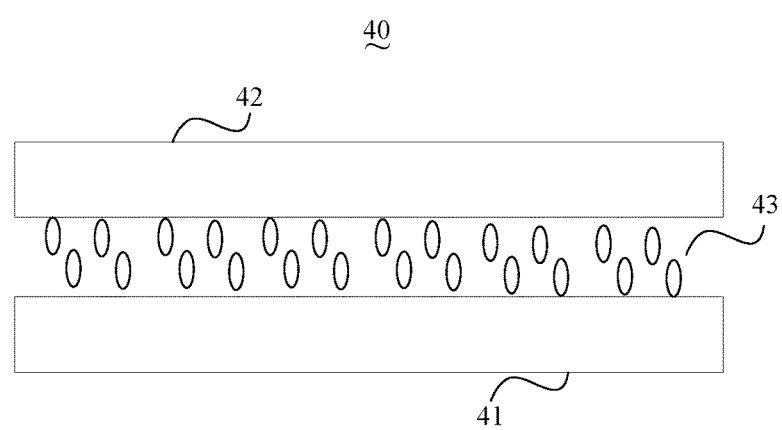
FIG. 6 is a schematic diagram of a display panel provided by an embodiment of the present invention.

The present invention also provides a display panel. With reference to FIG. 6, as shown in FIG. 6, the display panel 40 includes an array substrate 41 and a color filter substrate 42 which are disposed oppositely, and a liquid crystal layer 43 disposed between the array substrate 41 and the color filter substrate 42. Wherein, the array substrate 41 includes the array substrate 10, no more repeating.

In summary, the present embodiment forms the first protection layer, the spacer layer and the vias only through one process so as to reduce the manufacturing process in order to reach the purpose of simplifying the process. Besides, the present invention also manufactures a W color resist layer in order to increase the transmittance and brightness.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for an array substrate, comprising steps of:
    providing a substrate;
    disposing a thin-film transistor on the substrate;
    disposing a red (R) color resist layer, a green (G) color resist layer, a blue (B) color resist layer and a white (W) color resist layer on the thin-film transistor;
    forming a planarization layer on the R color resist layer, the G color resist layer, the B color resist layer and the W color resist layer, and through a multi-tone mask to form a first protection layer, a spacer layer and a vias, wherein, the first protection layer, the spacer layer and the vias have different thicknesses;
    wherein the step of disposing a thin-film transistor on the substrate comprises steps of:
    sequentially disposing a gate electrode layer, a gate insulation layer, a semiconductor layer, a source electrode layer, a drain electrode layer and a second protection layer in a stacked arrangement;
    wherein the step of disposing a red (R) color resist layer, a green (G) color resist layer, a blue (B) color resist layer and a white (W) color resist layer on the thin-film transistor comprises a step of:
    separately disposing the R color resist layer, the G color resist layer, the B color resist layer and the W color resist layer on the second protection layer, wherein the R color resist layer, the G color resist layer, the B color resist layer and the W color resist layer are located at a same layer, and forming a black matrix layer between two of the color resist layers by using a half-tone mask method in forming at least two of the R, G and B color resist layers.

2. The manufacturing method according to claim 1, wherein
    the vias reveals the source electrode layer or the drain electrode layer;
    wherein, the method further comprises a step of:
    disposing a pixel electrode on the planarization layer, wherein, the pixel electrode is electrically connected to the drain electrode layer or the source electrode layer through the vias.

3. The manufacturing method according to claim 1, wherein, the spacer layer includes a main spacer layer; and the step of through a multi-tone mask to form a first protection layer, a spacer layer and a vias comprises: providing a mask, wherein, a first region, a second region and a third region of the mask respectively have a first transmittance, a second transmittance and a third transmittance; through the mask to perform a patterning to the planarization layer in order to respectively form the first protection layer, the main spacer layer and the vias having different thicknesses.

4. The manufacturing method according to claim 3, wherein, the spacer layer further includes an auxiliary spacer layer, and a fourth region of the mask has a fourth transmittance;
    the method further comprises:
    when performing a patterning to the planarization layer through the mask, a location of the planarization layer corresponding to the fourth region, forming the auxiliary spacer layer that has a thickness different from the first protection layer, the main spacer layer and the vias.

5. An array substrate, comprising:
    a substrate;
    a thin-film transistor disposed on the substrate;
    a red (R) color resist layer, a green (G) color resist layer, a blue (B) color resist layer and a white (W) color resist layer on the thin-film transistor; and
    a planarization layer formed on the R color resist layer, the G color resist layer, the B color resist layer and the W color resist layer, wherein, the planarization layer is formed with a first protection layer, a spacer layer and a vias having different thicknesses through a multi-tone mask;
    the thin-film transistor comprises a gate electrode layer, a gate insulation layer, a semiconductor layer, a source electrode layer, a drain electrode layer and a second protection layer disposed in a stacked arrangement;
    wherein the vias reveals the source electrode layer or the drain electrode layer;
    the array substrate further comprises:
    a pixel electrode disposed on the planarization layer, wherein the pixel electrode is electrically connected to the drain electrode layer or the source electrode layer through the vias;
    the R color resist layer, the G color resist layer, the B color resist layer and the W color resist layer separately disposed on the second protection layer, wherein the R color resist layer, the G color resist layer, the B color resist layer and the W color resist layer are located at a same layer, and a black matrix layer is formed between two of the color resist layers by using a half-tone mask method in forming at least two of the R, G and B color resist layers.

6. The array substrate according to claim 5, wherein, the spacer layer includes a main spacer layer;
    wherein, the first protection layer, the main spacer layer and the vias having different thicknesses are formed through the multi-tone mask to perform a patterning to the planarization layer;
    wherein, a first region, a second region and a third region of the multi-tone mask respectively have a first transmittance, a second transmittance and a third transmittance.

7. The array substrate according to claim 6, wherein, the spacer layer further includes an auxiliary spacer layer, a thickness of the auxiliary spacer layer is different from the first protection layer, the main spacer layer and the vias, the auxiliary spacer layer is formed by patterning the planarization layer through the multi-tone mask, and a fourth region of the multi-tone mask has a fourth transmittance.

8. A display panel, wherein, the display panel includes an array substrate and a color filter substrate disposed oppositely and a liquid crystal layer disposed between the array substrate and the color filter substrate, and the array substrate comprises:

a substrate;

a thin-film transistor disposed on the substrate;

a red (R) color resist layer, a green (G) color resist layer, a blue (B) color resist layer and a white (W) color resist layer on the thin-film transistor; and a planarization layer formed on the R color resist layer, the G color resist layer, the B color resist layer and the W color resist layer, wherein, the planarization layer is formed with a first protection layer, a spacer layer and a vias having different thicknesses through a multi-tone mask;

the thin-film transistor comprises a gate electrode layer, a gate insulation layer, a semiconductor layer, a source electrode layer, a drain electrode layer and a second protection layer disposed in a stacked arrangement;

the vias reveals the source electrode layer or the drain electrode layer;

the array substrate further comprises:

a pixel electrode disposed on the planarization layer, wherein the pixel electrode is electrically connected to the drain electrode layer or the source electrode layer through the vias;

the R color resist layer, the G color resist layer, the B color resist layer and the W color resist layer separately disposed on the second protection layer, wherein the R color resist layer, the G color resist layer, the B color resist layer and the W color resist layer are located at a same layer, and a black matrix layer is formed between two of the color resist layers by using a half-tone mask method in forming at least two of the R, G and B color resist layers.

9. The display panel according to claim 8, wherein, the spacer layer includes a main spacer layer;

wherein, the first protection layer, the main spacer layer and the vias having different thicknesses are formed through the multi-tone mask to perform a patterning to the planarization layer;

wherein, a first region, a second region and a third region of the multi-tone mask respectively have a first transmittance, a second transmittance and a third transmittance.

10. The display panel according to claim 9, wherein, the spacer layer further includes an auxiliary spacer layer, a thickness of the auxiliary spacer layer is different from the first protection layer, the main spacer layer and the vias, the auxiliary spacer layer is formed by patterning the planarization layer through the multi-tone mask, and a fourth region of the multi-tone mask has a fourth transmittance.

* * * * *